United States Patent
Lee et al.

(10) Patent No.: US 8,427,247 B2
(45) Date of Patent: Apr. 23, 2013

(54) OSCILLATORS AND METHODS OF OPERATING THE SAME

(75) Inventors: Sung-chul Lee, Osan-si (KR); Sun-ae Seo, Hwaseong-si (KR); Young-jin Cho, Suwon-si (KR); Ung-hwan Pi, Seoul (KR); Kwang-seok Kim, Seongnam-si (KR); Ji-young Bae, Seongnam-si (KR)

(73) Assignee: Samsung Electronics Co, Ltd., Gyeonggi-Do (KR)

( * ) Notice: Subject to any disclaimer, the term of this patent is extended or adjusted under 35 U.S.C. 154(b) by 35 days.

(21) Appl. No.: 12/801,710

(22) Filed: Jun. 22, 2010

(65) Prior Publication Data
US 2011/0080221 A1   Apr. 7, 2011

(30) Foreign Application Priority Data
Oct. 5, 2009   (KR) .................. 10-2009-0094281

(51) Int. Cl.
*H03B 5/18* (2006.01)

(52) U.S. Cl.
USPC ......... 331/96; 331/94.1; 365/148; 360/324.1; 257/421

(58) Field of Classification Search ............ 365/148; 331/94.1, 96; 360/324.1; 257/421
See application file for complete search history.

(56) References Cited

U.S. PATENT DOCUMENTS

| | | | |
|---|---|---|---|
| 5,528,440 A | 6/1996 | Fontana et al. | |
| 6,914,759 B2 | 7/2005 | Chen et al. | |
| 7,280,029 B2 | 10/2007 | Mori et al. | |
| 7,471,491 B2* | 12/2008 | Sato et al. | 360/313 |
| 7,548,739 B2 | 6/2009 | Sato | |
| 8,013,408 B2* | 9/2011 | Maehara et al. | 257/421 |
| 2004/0207961 A1* | 10/2004 | Ichimura et al. | 360/324.2 |
| 2005/0219771 A1 | 10/2005 | Sato et al. | |
| 2008/0150643 A1 | 6/2008 | Suzuki et al. | |

FOREIGN PATENT DOCUMENTS
JP   2003-298148 A   10/2003

\* cited by examiner

*Primary Examiner* — Arnold Kinkead
(74) *Attorney, Agent, or Firm* — Harness, Dickey & Pierce, P.L.C.

(57) ABSTRACT

An oscillator includes: a plurality of free layers and a non-magnetic layer disposed between the plurality of free layers. Each of the plurality of free layers has perpendicular magnetic anisotropy or in-plane magnetic anisotropy. Magnetization directions of the free layers are periodically switched such that a signal within a given frequency band oscillates.

15 Claims, 5 Drawing Sheets

OSCILLATORS AND METHODS OF OPERATING THE SAME

CROSS-REFERENCE TO RELATED APPLICATION(S)

This application claims priority under 35 U.S.C. §119 to Korean Patent Application No. 10-2009-0094281, filed on Oct. 5, 2009, in the Korean Intellectual Property Office, the disclosure of which is incorporated herein in its entirety by reference.

BACKGROUND

1. Field

Example embodiments of inventive concepts relate to oscillators and methods of operating the same.

2. Description of the Related Art

Oscillators are devices that generate signals having given frequencies. Oscillators are used in wireless communication systems such as: mobile phones, satellite and radar communication devices, wireless network devices, automobile communication devices, analog sound synthesizers, and the like.

Mobile communication devices transmit information within a given frequency band. Conventionally, parts of a mobile communication device that are used to generate a signal within a given frequency band include a voltage controlled oscillator (VCO).

Main factors of an oscillator include an output power, a quality factor, and phase noise. As the output power and the quality factor of the oscillator increase, and the phase noise of the oscillator decreases, characteristics of the oscillator improve. Recently, higher output oscillators having smaller sizes, higher quality factor and lower phase noise have become more desirable as the demand for higher performance, miniaturization of communication devices, and operating frequency bands of communication devices has increased.

SUMMARY

Example embodiments provide oscillators having increased output power generated using spin transfer torque. Methods of operating oscillators are also disclosed.

Additional aspects will be set forth in part in the description which follows and, in part, will become more apparent from the description, or may be learned by practice of the presented example embodiments.

According to at least one example embodiment, an oscillator includes: a first free layer; a first non-magnetic layer disposed on the first free layer; and a second free layer disposed on the first non-magnetic layer. The second free layer corresponds to the first free layer.

According to at least some example embodiments, the first and second free layers may have perpendicular magnetic anisotropy. Alternatively, the first and second free layers may have in-plane magnetic anisotropy. The first non-magnetic layer may be one of a conductive layer and an insulating layer.

The first and second free layers may have the same or substantially the same thickness.

At least one of the first and second free layers may have a single layer structure. In addition, or alternatively, at least one of the first and second free layers may have a multi-layer structure.

According to at least some example embodiments, when the at least one of the first and second free layers has a multi-layer structure, the first free layer may include first and second layers sequentially disposed under the first non-magnetic layer, and the second free layer may include third and fourth layers sequentially disposed on the first non-magnetic layer. The first layer may be the same or substantially the same as the third layer, and the second layer may be the same or substantially the same as the fourth layer. The first free layer may have perpendicular magnetic anisotropy due to the second layer. The second free layer may have perpendicular magnetic anisotropy due to the fourth layer. A second non-magnetic layer and a third free layer may be alternately stacked at least one time on the second free layer. The third free layer may include the same or substantially the same material as the material for forming the first and second free layers.

At least one other example embodiment provides a method of operating an oscillator. According to at least this example embodiment, a current is applied to the oscillator, and a change in a resistance of the oscillator is detected. The oscillator may include: a first free layer; a first non-magnetic layer disposed on the first free layer; and a second free layer disposed on the first non-magnetic layer. The second free layer may correspond to the first free layer.

According to at least some example embodiments, the current may be direct current (DC). The current may be applied to the oscillator so as to pass through the first and second free layers. The first and second free layers may have perpendicular magnetic anisotropy. Alternatively, the first and second free layers may have in-plane magnetic anisotropy. A second non-magnetic layer and a third free layer may be alternately stacked at least one time on the second free layer.

BRIEF DESCRIPTION OF THE DRAWINGS

Example embodiments will become more apparent and readily appreciated from the following description of the drawings in which.

DETAILED DESCRIPTION

Figure 1:
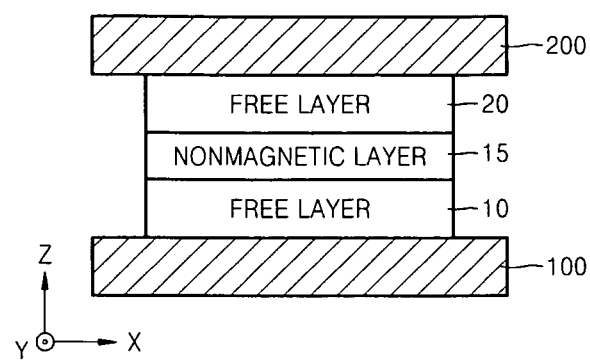
FIG. 1 is a cross-sectional view of an oscillator according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. General inventive concepts may, however, may be embodied in many alternate forms and should not be construed as limited to only the example embodiments set forth herein.

Accordingly, while general inventive concepts are capable of various modifications and alternative forms, example embodiments thereof are shown by way of example in the drawings and will herein be described in detail. It should be understood, however, that there is no intent to limit example embodiments to the particular forms disclosed, but on the contrary example embodiments are to cover all modifications, equivalents, and alternatives falling within the scope of general inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

Reference will now be made in detail to embodiments, examples of which are illustrated in the accompanying drawings, wherein like reference numerals refer to the like elements throughout. In this regard, example embodiments may have different forms and should not be construed as being limited to the descriptions set forth herein. Accordingly, the example embodiments are described below, by referring to the figures, to explain aspects of the present description.

FIG. 1 is a cross-sectional view of an oscillator according to an example embodiment.

Referring to FIG. 1, an oscillator includes first and second free layers 10 and 20 that are separated from one another by a non-magnetic layer 15 interposed between the first and second free layers 10 and 20. The first and second free layers 10 and 20 have variable magnetization directions as compared to pinned layers whose magnetization directions are fixed. The first and second free layers 10 and 20 may have perpendicular magnetic anisotropy or in-plane magnetic anisotropy. When the first and second free layers 10 and 20 have perpendicular magnetic anisotropy, the first and second free layers 10 and 20 may be alloy layers formed of an alloy including, for example, cobalt (Co). For example, the alloy layers may include cobalt-platinum (CoPt), cobalt-chromium-platinum (CoCrPt), or the like. Alternatively, the first and second free layers 10 and 20 may have a multi-layer structure in which a layer including at least one of Co and a Co alloy (or similar material) and a layer including at least one of platinum (Pt), nickel (Ni), palladium (Pd) (or similar material) are alternately stacked.

When the first and second free layers 10 and 20 have in-plane magnetic anisotropy, the first and second free layers 10 and 20 may be material layers including, for example, at least one of Co, Ni, iron (Fe), or the like. In one example, the first and second free layers 10 and 20 may include cobalt-iron-boron (CoFeB), nickel iron (NiFe), or the like. However, materials/structures of the first and second free layers 10 and 20 are not limited thereto. For example, the first and second free layers 10 and 20 may be formed of any material for forming a free layer in a general magnetic device. Thicknesses of the first and second free layers 10 and 20 may be between about 1 nm and about 10 nm, inclusive. For example, thicknesses of the first and second free layers 10 and 20 may be between about 1 nm and about 5 nm, inclusive. The thicknesses of the first and second free layers 10 and 20 may be the same, substantially the same or different.

The non-magnetic layer 15 interposed between the first and second free layers 10 and 20 may be a conductive layer or an insulating layer. For example, the non-magnetic layer 15 may be a conductive layer including at least one of copper (Cu), aluminium (Al), gold (Au), silver (Ag), any combination thereof or the like. The insulating layer may be a layer including an oxide such as magnesium oxide (MgO), aluminium oxide (AlOx), or the like. The thickness of the non-magnetic layer 15 may be between about 1 nm and about 3 nm, inclusive.

Returning to FIG. 1, a first electrode 100 is disposed under the first free layer 10, and a second electrode 200 is disposed on the second free layer 20. The first and second electrodes 100 and 200 may be formed of any electrode material used in general electronic devices. But, structures and sizes of the first and second electrodes 100 and 200 are not limited thereto and may be varied. For example, the first and second electrodes 100 and 200 may be formed having the same or substantially the same widths as the first and second free layers 10 and 20. The first and second electrodes 100 and 200 may be optionally disposed depending on the materials used to form the first and second free layers 10 and 20. For example, when electrical resistances of the first and second free layers 10 and 20 are sufficiently low, the first and second free layers 10 and 20 themselves may be used as electrodes. In this example, the first and second electrodes 100 and 200 may be omitted.

An example method of operating the oscillator of FIG. 1 will now be described with reference to FIGS. 2 and 3.

Figure 2:
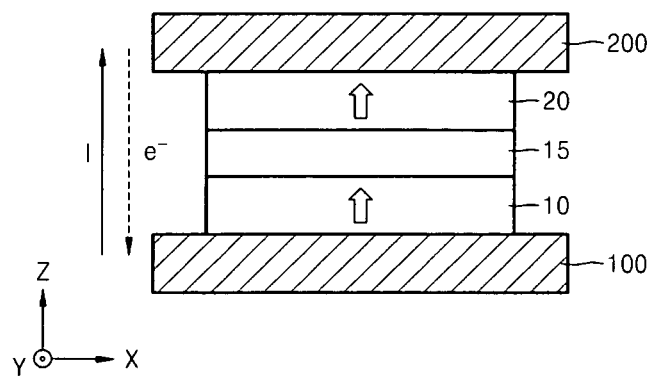
FIG. 2 is a cross-sectional view illustrating a method of operating an oscillator according to an example embodiment.

FIG. 2 is a cross-sectional view illustrating a method of operating the oscillator of FIG. 1 according to an example embodiment.

Referring to FIG. 2, the first and second free layers 10 and 20 have perpendicular magnetic anisotropy. In this case, magnetization easy axes of the first and second free layers 10 and 20 are parallel to a Z-axis, and the first and second free layers 10 and 20 are magnetized in a Z-axis direction. Arrows in the first and second free layers 10 and 20 represent magnetization directions thereof. To operate the oscillator, a current I is applied from one of the first and second electrodes 100 and 200 to the other. In FIG. 2, the current I is applied from the first electrode 100 to the second electrode 200. The current I may be a direct current (DC).

Because the direction of the current I and the direction of an electrons e⁻ are opposite, in this example the electrons e⁻ flow from the second electrode 200 to the first electrode 100. When the electrons e⁻ flow from the second electrode 200 to the first electrode 100 via the second free layer 20 and the first free layer 10, the magnetization directions of the first and second free layers 10 and 20 periodically vary over a given time period.

Figure 3:
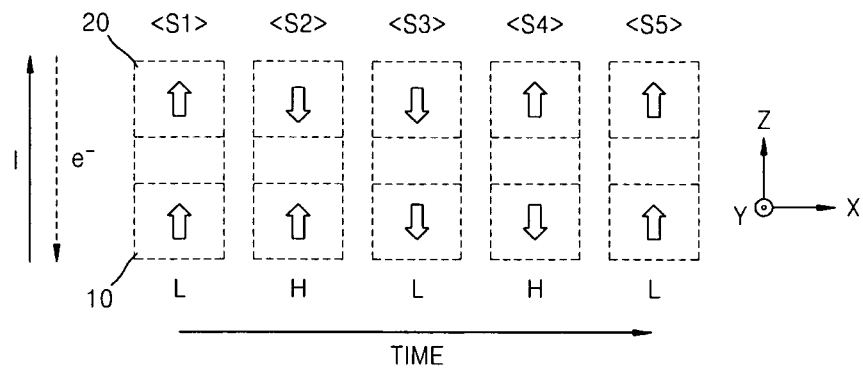
FIG. 3 is a graph showing an example change in magnetization directions of free layers when a current is applied to the oscillator illustrated in FIG. 1.

FIG. 3 is a graph showing an example change in magnetization directions of the first and second free layers 10 and 20 when a current I is applied as illustrated in FIG. 2.

Referring to FIG. 3, the first and second free layers 10 and 20 are magnetized in a positive Z-axis direction at an initial stage, which is referred to as first stage S1. In this case, the first and second free layers 10 and 20 are in a parallel state. If the current I is applied to the first and second free layers 10 and 20, the magnetization direction of the second free layer 20 switches to a reverse Z-axis direction as shown in second stage S2. In the second stage S2, the first and second free layers 10 and 20 are in an anti-parallel state. The magnetization direction of the first free layer 10 then switches to the reverse Z-axis direction as shown in third stage S3. In the third stage S3, the first and second free layers 10 and 20 are in a parallel state.

In a fourth stage S4, the magnetization direction of the second free layer 20 switches to the Z-axis direction, and in a fifth stage S5 the magnetization direction of the first free layer 10 switches to the Z-axis direction. Thus, in the fourth stage S4, the first and second free layers 10 and 20 are in an anti-parallel state, whereas in the fifth stage S5 the first and second free layers 10 and 20 are in a parallel state. In this example, the fifth stage S5 is the same as the first stage S1.

After the fifth stage S5, second through fifth stages S2 to S5 may be repeated. As a result, the magnetization directions of the first and second free layers 10 and 20 may be periodically varied over time by the current I. Thus, according to example embodiments, a parallel state in which the magnetization direction of the first free layer 10 and the magnetization direction of the second free layer 20 are the same, and an anti-parallel state where the magnetization direction of the first free layer 10 and the magnetization direction of the second free layer 20 are opposite to each other is periodic.

When the first and second free layers 10 and 20 are in a parallel state, a resistance of the oscillator decreases (e.g., to a relative low or relative minimum). But, when the first and second free layers 10 and 20 are in an anti-parallel state, the resistance of the oscillator increases (e.g., to a relative high or relative maximum). Thus, the resistance of the oscillator in first, second, third, fourth, and fifth stages S1, S2, S3, S4, and S5 may be low L, high H, low L, high H, and low L, respectively, and the resistance of the oscillator may oscillate by repeating the low L and high H states. In this example, the resistance of the oscillator refers to an electrical resistance between the first and second electrodes 100 and 200. The oscillator of FIG. 1 may have a relatively high output power and may generate a signal within a given frequency band.

FIG. 3 shows an example in which magnetization directions of the first and second free layers 10 and 20 may be varied. The magnetization directions of the first and second free layers 10 and 20 are not limited to the example shown in FIG. 3.

Figure 4:
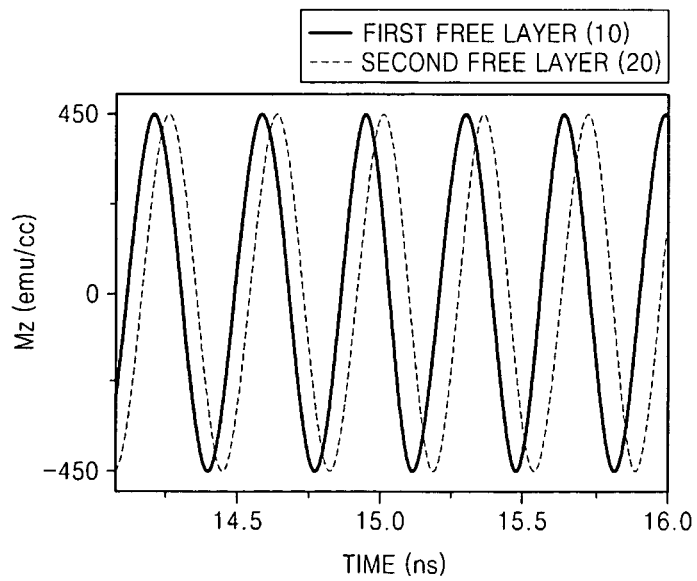
FIG. 4 is a graph showing an example change in magnetization of free layers according to time when a current is applied to the oscillator of FIG. 1.

FIG. 4 is a graph showing an example change in vertical magnetization Mz of the first and second free layers 10 and 20 according to time when a current I is applied as illustrated in FIG. 2. In this example, the first and second free layers 10 and 20 are CoCrPt layers having perpendicular magnetic anisotropy. In addition, a product "Rp·A" of a resistance Rp of the oscillator in a parallel state and a cross-sectional area A with respect to an XY plane of the first or second free layer 10 or 20 is about 0.2 μΩ·cm². A magneto-resistance ratio is about 100%.

Referring to FIG. 4, the amount of vertical magnetization Mz of the first free layer 10 and the amount of vertical magnetization Mz of the second free layer 20 periodically vary between about −450 emu/cc and about 450 emu/cc for a given time interval.

Figure 5:
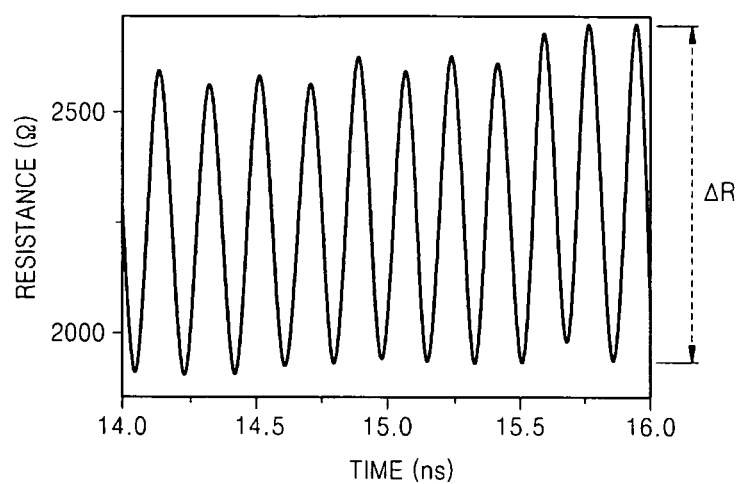
FIG. 5 is a graph showing an example change in the resistance of the oscillator of FIG. 1 according to time when a current is applied to the oscillator of FIG. 1.

FIG. 5 is a graph showing an example change in the resistance of the oscillator of FIG. 1 according to time when a current I is applied as illustrated in FIG. 2. In this example, the change in the resistance of the oscillator refers to a change in the resistance between the first and second electrodes 100 and 200.

Referring to FIG. 5, the resistance of the oscillator periodically varies thereby generating a signal within a given frequency band. In this case, the amount of resistance change ΔR is about 700Ω. Thus, when a current of about 1 MA/cm² is applied to the oscillator of FIG. 1, an output power thereof may be as high as about 2 μW.

A general oscillator includes a free layer and a pinned layer corresponding to the free layer. In this case, an output power of the general oscillator is as low as about 1 nW, and thus, is relatively difficult to use in various fields. For example, when the pinned layer and the free layer have in-plane magnetic anisotropy, a current (e.g., an alternating current (AC)) and a magnetic field are applied to the oscillator to operate the oscillator. In this case, the structure of the oscillator is relatively complex, and controlling the operation of the oscillator is relatively difficult. Moreover, additional material layers including an anti-ferromagnetic layer are required to fix the magnetization direction of the pinned layer. Thus, the structure of the oscillator is relatively complex and the size thereof increases.

However, according to at least some example embodiments, an oscillator uses a plurality of free layers to produce relatively high output power. The oscillator need not (and does not) include a pinned layer, and thus, the structure thereof may be simplified. In addition, the oscillator may be operated using a relatively simple method of applying DC to the oscillator.

In FIG. 1, the oscillator includes two free layers 10 and 20. However, according to at least some example embodiments, oscillators may include three or more free layers. Examples thereof are shown in FIGS. 6 and 7.

Figure 6:
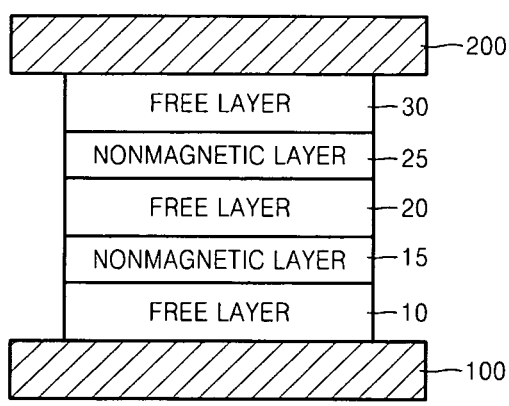
FIGS. 6 through 8 are cross-sectional views of oscillators according to other example embodiments.
Figure 7:
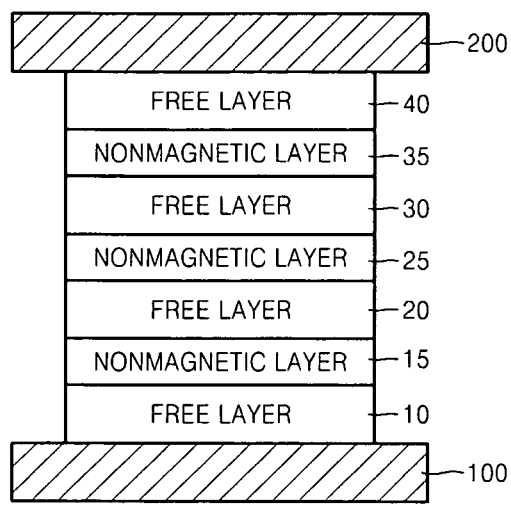

FIGS. 6 and 7 are cross-sectional views of oscillators according to other example embodiments. The structures of the oscillators illustrated in FIGS. 6 and 7 are a modified structure of the oscillator of FIG. 1.

Referring to FIG. 6, three free layers (hereinafter, referred to as first through third free layers) 10, 20, and 30 are sequentially disposed between first and second electrodes 100 and 200. A first non-magnetic layer 15 is disposed between the first free layer 10 and the second free layer 20. A second non-magnetic layer 25 is disposed between the second free layer 20 and the third free layer 30. Each of the first through third free layers 10, 20, and 30 of FIG. 6 may be the same or substantially the same as any of the first and second free layers 10 and 20 of FIG. 1. Each of the first and second non-magnetic layers 15 and 25 of FIG. 6 may be the same or substantially the same as the non-magnetic layer 15 of FIG. 1. For example, the structure of the oscillator of FIG. 6 may be a structure in which the second non-magnetic layer 25 and the third free layer 30 are additionally stacked between the second free layer 20 and the second electrode 200 of FIG. 1.

Referring to FIG. 7, four free layers (hereinafter, referred to as first through fourth free layers) 10, 20, 30, and 40 are sequentially disposed between first and second electrodes 100 and 200. A first non-magnetic layer 15 is disposed between the first and second free layers 10 and 20, a second non-magnetic layer 25 is disposed between the second and third free layers 20 and 30, and a third non-magnetic layer 35 is disposed between the third and fourth free layers 30 and 40. Each of the first through fourth free layers 10, 20, 30, and 40 of FIG. 7 may be the same or substantially the same as any of the first and second free layers 10 and 20 of FIG. 1. Each of the first through third non-magnetic layers 15, 25, and 35 of FIG. 7 may be the same or substantially the same as the non-magnetic layer 15 of FIG. 1. For example, the structure of the oscillator of FIG. 7 may be a structure in which the second non-magnetic layer 25, the third free layer 30, the third non-magnetic layer 35, and the fourth free layer 40 are additionally stacked between the second free layer 20 and the second electrode 200 of FIG. 1.

Although not shown, the oscillator of FIG. 7 may include five or more free layers. In this example, an additional non-magnetic layer and an additional free layer may be repeatedly stacked at least one time between the fourth free layer 40 and the second electrode 200 of FIG. 7.

Even when the oscillators of FIGS. 6 and 7 include three or more free layers, a method of operating the oscillator may be similar or substantially similar to the method of FIG. 2. For example, the oscillator may be operated by applying a current between the first and second electrodes 100 and 200 and which passes through the free layers. An output power of the oscillator may be further increased when the number of free layers is increased.

Figure 8:
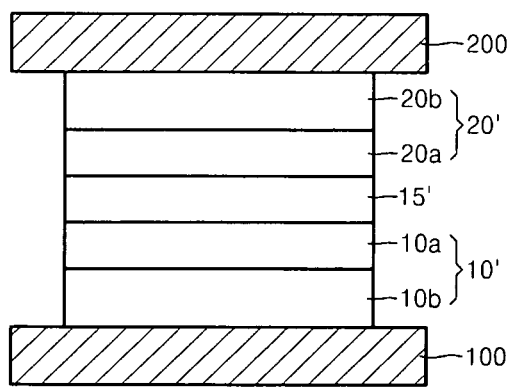

FIG. 8 is a cross-sectional view of an oscillator according to another example embodiment. The structure of the oscillator of FIG. 8 is a similar, but modified, structure of the oscillator of FIG. 1.

Referring to FIG. 8, a first free layer 10' is disposed under a non-magnetic layer 15'. A second free layer 20' is disposed on the non-magnetic layer 15'. The first free layer 10' is a multi-layer structure including a first layer 10a and a second layer 10b that are sequentially disposed under the non-magnetic layer 15'. The second free layer 20' is also a multi-layer structure including a third layer 20a and a fourth layer 20b that are sequentially disposed on the non-magnetic layer 15'. The first layer 10a may be a material layer having in-plane magnetic anisotropy, such as a CoFeB layer or the like. The second layer 10b may be a material layer having perpendicular magnetic anisotropy. In this example, when the second layer 10b having perpendicular magnetic anisotropy contacts the first layer 10a having in-plane magnetic anisotropy, the first free layer 10' may have perpendicular magnetic anisotropy. This is because the magnetization easy axis of the first layer 10a having in-plane magnetic anisotropy is perpendicularly varied due to the second layer 10b having perpendicular magnetic anisotropy. The third layer 20a may be the same or substantially the same as the first layer 10a, and the fourth layer 20b may be the same or substantially the same as the second layer 10b. Thus, the second free layer 20' including the third and fourth layers 20a and 20b also has perpendicular magnetic anisotropy. The second and fourth layers 10b and 20b may have a single layer structure or a multi-layer structure. Meanwhile, the non-magnetic layer 15' may be an insulating layer such as MgO and AlOx, or a conductive layer including at least one of Cu, Al, Au, Ag, any combination thereof or the like. The oscillator may include three or more free layers such as the free layers 10' and 20' of FIG. 8.

Hereinafter, a method of operating an oscillator according to an example embodiment will be described. A method according to an example embodiment has been previously described with reference to FIGS. 2 and 3.

Figure 9:
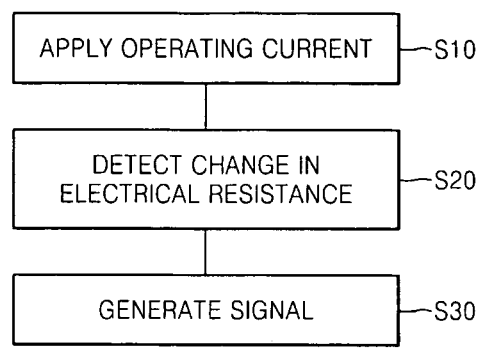
FIG. 9 is a flowchart illustrating a method of operating an oscillator according to an example embodiment.

FIG. 9 is a flowchart illustrating the method of operating an oscillator according to an example embodiment.

Referring to FIG. 9, at S10 a current is applied to the oscillator. Referring to FIGS. 1 and 6 through 8, for example, the current may be applied between the first and second electrodes 100 and 200. The current may be a DC. When the first and second electrodes 100 and 200 are omitted, the current may be applied between the free layers disposed at ends of the oscillator. The magnetization directions of the free layers 10, 10', 20, 20', 30, and 40 is repeatedly switched over time in response to the applied current.

At S20, a change in an electrical resistance of the oscillator is detected while the magnetization directions of the free layers 10, 10', 20, 20', 30, and 40 are repeatedly switched. Referring again to FIGS. 1 and 6 through 8, this change in the electrical resistance of the oscillator refers to the change in electrical resistance between the first and second electrodes 100 and 200. In this example, the electrical resistance periodically varies as the magnetization directions of the free layers are switched. An example of this point has been described with reference to FIGS. 3 through 5, and thus, will not be described again.

At S30, a signal having a given frequency is generated due to the change in electrical resistance. The frequency of a signal generated by the oscillator may be varied by controlling the current or the sizes, shapes, and/or properties of the free layers 10, 10', 20, 20', 30, and 40.

While inventive concepts have been particularly shown and described with reference to example embodiments thereof, it will be understood by those of ordinary skill in the art that various changes in form and details may be made therein without departing from the spirit and scope as defined by the following claims. The structures of the oscillators of FIG. 1 and FIGS. 6 through 8 may be modified in various ways, and methods of operating each of the oscillators of FIG. 1 and FIGS. 6 through 8 may be varied in various ways.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. An oscillator comprising:
    a first free layer;
    a first non-magnetic layer disposed on the first free layer; and
    a second free layer disposed on the first non-magnetic layer, the second free layer corresponding to the first free layer; wherein
        the oscillator is configured to generate a frequency signal by using direct current (DC) applied to the oscillator,
        magnetization directions of the first and second free layers are configured to periodically repeat with a time interval by the direct current (DC), and
        a parallel state and an anti-parallel state of the magnetization directions periodically repeat.

2. The oscillator of claim 1, wherein the first free layer and the second free layer have perpendicular magnetic anisotropy.

3. The oscillator of claim 1, wherein the first free layer and the second free layer have in-plane magnetic anisotropy.

4. The oscillator of claim 1, wherein the first non-magnetic layer is one of a conductive layer and an insulating layer.

5. An oscillator comprising:
a first free layer;
a first non-magnetic layer disposed on the first free layer; and
a second free layer disposed on the first non-magnetic layer, the second free layer corresponding to the first free layer; wherein
the first free layer and the second free layer have the same thickness.

6. An oscillator comprising:
a first free layer;
a first non-magnetic layer disposed on the first free layer;
a second free layer disposed on the first non-magnetic layer, the second free layer corresponding to the first free layer;
a second non-magnetic layer stacked on the second free layer; and
a third free layer stacked on the second non-magnetic layer.

7. The oscillator of claim 6, wherein the third free layer comprises:
a same material as the first free layer and the second free layer.

8. An oscillator comprising:
a first free layer;
a first non-magnetic layer disposed on the first free layer; and
a second free layer disposed on the first non-magnetic layer, the second free layer corresponding to the first free layer; wherein
at least one of the first free layer and the second free layer has a multi-layer structure.

9. The oscillator of claim 8, wherein the first free layer includes,
first and second layers sequentially disposed under the first non-magnetic layer, and
the second free layer includes,
third and fourth layers sequentially disposed on the first non-magnetic layer, and wherein
the first layer is the same as the third layer, and
the second layer is the same as the fourth layer.

10. The oscillator of claim 9, wherein the first free layer and the second free layer have perpendicular magnetic anisotropy.

11. A method of operating an oscillator, the method comprising:
applying a direct current (DC) to the oscillator to generate a frequency signal, the oscillator including a first free layer, a first non-magnetic layer disposed on the first free layer, and a second free layer disposed on the first non-magnetic layer, the second free layer corresponding to the first free layer; and
detecting a change in a resistance of the oscillator; wherein
magnetization directions of the first and second free layers periodically repeat with a time interval by the direct current (DC), and
a parallel state and an anti-parallel state of the magnetization directions periodically repeat.

12. The method of claim 11, wherein the current is applied to the oscillator so as to pass through the first free layer and the second free layer.

13. The method of claim 11, wherein the first free layer and the second free layer have perpendicular magnetic anisotropy.

14. The method of claim 11, wherein the first free layer and the second free layer have in-plane magnetic anisotropy.

15. A method of operating an oscillator, the method comprising:
applying a current to the oscillator, the oscillator including a first free layer, a first non-magnetic layer disposed on the first free layer, and a second free layer disposed on the first non-magnetic layer, the second free layer corresponding to the first free layer; and
detecting a change in a resistance of the oscillator; wherein
a second non-magnetic layer is disposed on the second free layer and a third free layer is disposed on the second non-magnetic layer.

* * * * *